United States Patent
Suetsugi et al.

(10) Patent No.: US 12,344,928 B2
(45) Date of Patent: Jul. 1, 2025

(54) ELECTRODE AND METHOD OF PRODUCING THE ELECTRODE

(71) Applicant: NITTO DENKO CORPORATION, Ibaraki (JP)

(72) Inventors: Tomokazu Suetsugi, Ibaraki (JP); Kazuki Sasahara, Ibaraki (JP); Motoki Haishi, Ibaraki (JP)

(73) Assignee: NITTO DENKO CORPORATION, Ibaraki (JP)

(*) Notice: Subject to any disclaimer, the term of this patent is extended or adjusted under 35 U.S.C. 154(b) by 0 days.

(21) Appl. No.: 18/283,593

(22) PCT Filed: Mar. 23, 2022

(86) PCT No.: PCT/JP2022/013729
§ 371 (c)(1),
(2) Date: Sep. 22, 2023

(87) PCT Pub. No.: WO2022/202941
PCT Pub. Date: Sep. 29, 2022

(65) Prior Publication Data
US 2024/0167146 A1 May 23, 2024

(30) Foreign Application Priority Data

Mar. 23, 2021 (JP) .................. 2021-048725
Mar. 23, 2022 (JP) .................. 2022-046632

(51) Int. Cl.
*G01N 27/30* (2006.01)
*C23C 14/02* (2006.01)
(Continued)

(52) U.S. Cl.
CPC ........ *C23C 14/0605* (2013.01); *C23C 14/024* (2013.01); *C23C 14/35* (2013.01); *G01N 27/308* (2013.01); *H01J 37/3277* (2013.01)

(58) Field of Classification Search
None
See application file for complete search history.

(56) References Cited

U.S. PATENT DOCUMENTS

2015/0037710 A1* 2/2015 Cooke ................... C23C 28/322
216/13
2017/0088938 A1* 3/2017 Ueda ..................... C23C 14/568
2017/0153200 A1 6/2017 Komoto

FOREIGN PATENT DOCUMENTS

CN 1186353 A * 7/1998
JP H2-133593 A 5/1990
(Continued)

OTHER PUBLICATIONS

International Search Report issued on May 31, 2022, for corresponding International Patent Application No. PCT/JP2022/013729, along with an English translation (6 pages).
(Continued)

*Primary Examiner* — Jason Berman
(74) *Attorney, Agent, or Firm* — Hauptman Ham, LLP

(57) ABSTRACT

An electrode includes a substrate film, a metal underlying layer, and a conductive carbon layer. A ratio (O/C) of oxygen to carbon at a place 4.5 nm away from a one-side surface of the conductive carbon layer toward the other side in the thickness direction is less than 0.01 where the ratio (O/C) of oxygen to carbon is measured using X-ray photoelectron spectroscopy.

7 Claims, 2 Drawing Sheets

(51) Int. Cl.
*C23C 14/06* (2006.01)
*C23C 14/35* (2006.01)
*H01J 37/32* (2006.01)

(56) References Cited

FOREIGN PATENT DOCUMENTS

| JP | 2005-310995 A | 11/2005 |
| JP | 2011-109942 A | 6/2011 |
| JP | 2017-122261 A | 7/2017 |
| JP | 2018-155728 A | 10/2018 |
| JP | 2020-144116 A | 9/2020 |
| JP | 2021-56205 A | 4/2021 |
| WO | 2016/013478 A1 | 1/2016 |

OTHER PUBLICATIONS

Written Opinion issued on May 31, 2022, for corresponding International Patent Application No. PCT/JP2022/013729 (4 pages).
Takemoto et al., "Controlling Surface Oxygen Concentration of a Nanocarbon Film Electrode for Improvement of Target Analytes," Analytical Sciences, Apr. 2020, vol. 36, pp. 441-446; Cited in NPL Nos. 1 and 2.
Notification Concerning Transmittal of Copy of International Preliminary Report on Patentability (PCT/IB/326) issued on Oct. 5, 2023 for corresponding International Patent Application No. PCT/JP2022/013729 (6 pages).
Notification of Transmittal of Copies of Translation of the International Preliminary Report on Patentability (PCT/IB/338) issued on Oct. 5, 2023 for corresponding International Patent Application No. PCT/JP2022/013729 (6 pages).

* cited by examiner

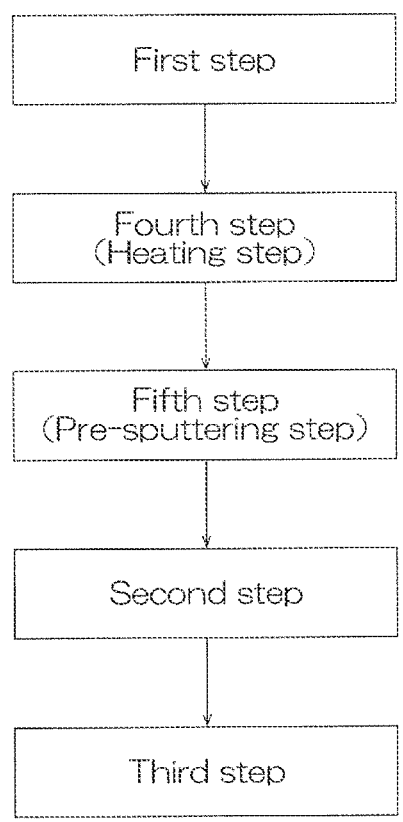

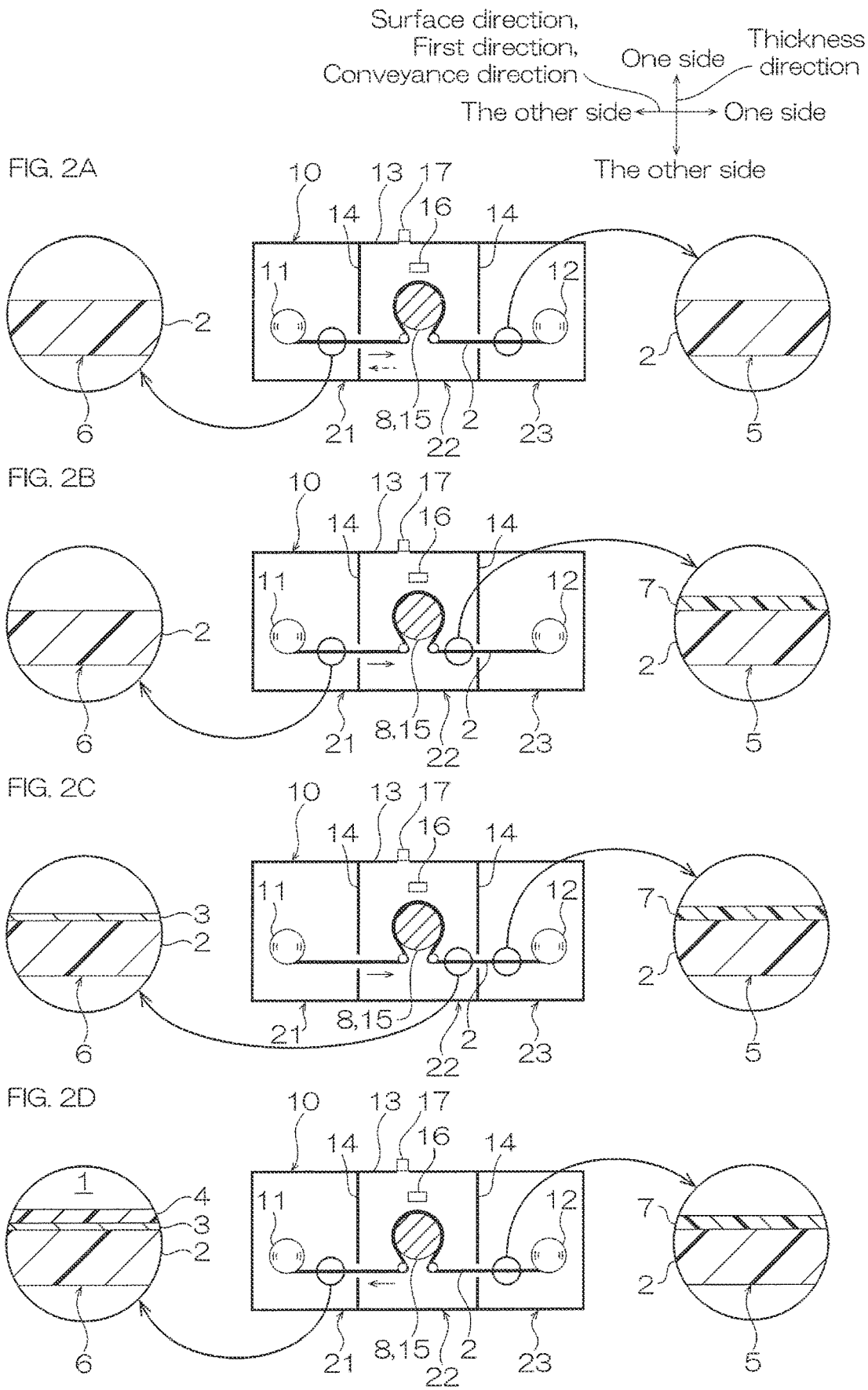

ELECTRODE AND METHOD OF PRODUCING THE ELECTRODE

CROSS REFERENCE TO RELATED APPLICATION

This application is a National Stage of International Application No. PCT/JP2022/013729, filed on Mar. 23, 2022, which designates the United States and was published in Japan, and which is based upon and claims priority to Japanese Patent Application No. 2021-048725, filed on Mar. 23, 2021, and Japanese Patent Application No. 2022-046632, filed on Mar. 23, 2022, in the Japan Patent Office. All of the aforementioned applications are hereby incorporated by reference in their entireties.

TECHNICAL FIELD

The present invention relates to an electrode and a method of producing the electrode.

BACKGROUND ART

There is a known method of producing an electrode by carrying out sputtering to dispose the conductive carbon layer on a one-side surface of the substrate film in the thickness direction (for example, see Patent document 1 below).

CITATION LIST

Patent Document

Patent Document 1: PCT International Publication No. WO2016/013478

SUMMARY OF THE INVENTION

Problem to be Solved by the Invention

Such electrodes are required to have more excellent durability. However, there is a limit to the method described in Patent Document 1. The durability includes the capability of suppressing the decrease in performance of the electrode even after the electrode has been stored for a long period of time.

The present invention provides an electrode having excellent durability of its electrode activity and a method of producing the electrode.

Means for Solving the Problem

The present invention [1] includes an electrode including: a substrate film, a metal underlying layer, and a conductive carbon layer in this order toward one side in a thickness direction, wherein a ratio (O/C) of oxygen to carbon at a place 4.5 nm away from a one-side surface of the conductive carbon layer toward the other side in the thickness direction is less than 0.01, and wherein the ratio (O/C) of oxygen to carbon is measured using X-ray photoelectron spectroscopy.

The present invention [2] includes the electrode described in the above-described [1], wherein a ratio (O/C) of oxygen to carbon at the one-side surface of the conductive carbon layer is 0.1 or less.

The present invention [3] includes the electrode described in the above-described [1] or [2], wherein the conductive carbon layer has an sp$^2$ bond and an sp$^3$ bond.

The present invention [4] includes a method of producing the electrode according to any one of claims 1 to 3, the method including: a first step of preparing the substrate film; a second step of disposing the metal underlying layer on a one-side surface of the substrate film in the thickness direction; and a third step of carrying out sputtering under an atmosphere under which a partial pressure of water is $1.40 \times 10^{-4}$ Pa or less to dispose the conductive carbon layer on a one-side surface of the metal underlying layer in the thickness direction.

The present invention [5] includes the method described in the above-described [4], further including: a fourth step of heating the substrate film under a reduced-pressure atmosphere at a time after the first step and before the third step, wherein a material of the substrate film is resin.

The present invention [6] includes the method described in the above-described [4] or [5], further including: a fifth step of carrying out sputtering at a time after the first step and before the second step to dispose a second conductive carbon layer on one side of the substrate film in the thickness direction, wherein in the fifth step, the second step, and the third step, a chamber common to the steps is used for a roll-to-roll method.

The present invention [7] includes the method described in any one of the above-described [4] to [6], wherein the substrate film having a thickness of 10 μm or more and 500 μm or less is prepared in the first step.

Effects of the Invention

An electrode produced by the method of the present invention has excellent durability of its electrode activity.

BRIEF DESCRIPTION OF THE DRAWINGS

FIG. 1 is a flowchart of one embodiment of the method of producing the electrode of the present invention.

FIGS. 2A to 2D illustrate the production steps based on FIG. 1. FIG. 2 illustrates the first step and the fourth step. FIG. 2B illustrates the fifth step. FIG. 2C illustrates the second step. FIG. 2D illustrates the third step.

DESCRIPTION OF THE EMBODIMENT

One Embodiment

One embodiment of the electrode of the present invention is described with reference to the enlarged view on the left side of FIG. 2D.

An electrode 1 has a thickness. The electrode 1 extends in a surface direction. The surface direction is orthogonal to the thickness direction. The electrode 1 has a film shape extending in the surface direction. The electrode 1 includes a substrate film 2, a metal underlying layer 3, and a conductive carbon layer 4 in this order toward one side in the thickness direction.

The substrate film 2 has a film shape extending in the surface direction.

Examples of the material of the substrate film 2 include resin and ceramic materials (for example, silicon). In view of securing excellent flexibility, resin is preferable.

Examples of the resin include polyester resin, acetate resin, polyether sulfone resin, polycarbonate resin, polyamide resin, polyimide resin, polyolefin resin (for example, polyethylene, polypropylene, polycycloolefin polymer), (meth)acrylic resin, polyvinyl chloride resin, polyvinylidene chloride resin, polystyrene resin, polyvinyl alcohol resin, polyarylate resin, and polyphenylenesulfide resin. Polyester resin is preferable. Examples of the polyester resin include polyethylene terephthalate, polybutylene telephthalate, and polyethylene naphthalate. Where the resin is polyester resin (more preferably, polyethylene terephthalate), the substrate film 2 has excellent flexibility while there is a tendency for the partial pressure of the water in atmosphere to increase in the third step. This is because the water content of polyester resin is relatively high. However, in the present embodiment, even when the resin is a polyester resin, carrying out the fourth step (heating step) suppresses the increase in the partial pressure of the water in the third step.

The substrate film 2 has a thickness of, for example, 2 μm or more, preferably 10 μm or more, and, for example, 1000 μm or less, preferably 500 μm or less. When the thickness of the substrate film 2 is within the above-described range, a roll-to-roll method can be carried out with the conveyable properties of the film.

The metal underlying layer 3 is disposed on a one-side surface of the substrate film 2 in the thickness direction. The material of the metal underlying layer 3 is not limited. Examples of the material of the metal underlying layer 3 include titanium, tantalum, chromium, molybdenum, and tungsten. In view of the stability of the electrode 1, titanium is preferable.

The metal underlying layer 3 has a thickness of, for example, 5 nm or more, preferably 6 nm or more and, for example, 50 nm or less, preferably 20 nm or less.

The conductive carbon layer 4 is disposed on a one-side surface of the metal underlying layer 3 in the thickness direction. The physical properties of the conductive carbon layer 4 are not limited. For example, the conductive carbon layer 4 has an $sp^2$ bond and an $sp^3$ bond. In other words, the conductive carbon layer 4 contains carbon having an $sp^2$ bond and carbon having an $sp^3$ bond as main components. In other words, the conductive carbon layer 4 is a layer having a graphite structure and a diamond structure.

The ratio of the number of $sp^3$ bonded atoms to the sum of the number of $sp^3$ bonded atoms and the number of $sp^2$ bonded atoms is not limited. The ratio of the number of $sp^3$ bonded atoms to the sum of the number of $sp^3$ bonded atoms and the number of $sp^2$ bonded atoms is, for example, 0.1 or more and 0.9 or less.

At the place 4.5 nm away from the one-side surface of the conductive carbon layer 4 toward the other side in the thickness direction, the ratio (O/C) of oxygen to carbon is less than 0.01.

When the ratio (O/C) of oxygen to carbon is 0.01 or more at the place 4.5 nm away from the one-side surface of the conductive carbon layer 4 toward the other side in the thickness direction, the durability of the electrode 1 decreases. Especially, the activity of the electrode 1 on ferricyan decreases after a long-term storage.

The ratio (O/C) of oxygen to carbon at the place 4.5 nm away is preferably 0.009 or less, more preferably 0.007 or less, even more preferably 0.005 or less, particularly preferably 0.003 or less. The lower limit of the ratio (O/C) of oxygen to carbon is not limited. The lower limit of the ratio (O/C) of oxygen to carbon at the place 4.5 nm away is, for example, 0.000.

The ratio of oxygen to carbon is measured using X-ray photoelectron spectroscopy (ESCA). The ratio is the ratio of the atomic percent [at. %] of oxygen to the atomic percent [at. %] of carbon.

The conditions for the measurement of X-ray photoelectron spectroscopy is described in Examples.

The ratio (O/C) of oxygen to carbon at the one-side surface of the conductive carbon layer 4 is, for example, 0.1 or less, preferably 0.07 or less, more preferably 0.05 or less. The ratio (O/C) of oxygen to carbon at the one-side surface of the conductive carbon layer 4 is, for example, 0.00 or more, preferably 0.01 or more.

When the ratio (O/C) of oxygen to carbon at the one-side surface of the conductive carbon layer 4 is the above-described upper limit or less, the decrease in the activity of the electrode 1 on ferricyan after a long-term storage is suppressed.

The thickness of the conductive carbon layer 4 is not limited. The thickness of the conductive carbon layer 4 is, for example, 0.1 nm or more, preferably 1 nm or more, and 100 nm or less, preferably 50 nm or less.

One embodiment of the method of producing the electrode of the present invention is described with reference to FIG. 1 to FIG. 2D.

As illustrated in FIG. 1, the method of producing the electrode 1 includes a first step, a second step, and a third step as its essential steps. Further, the method of producing the electrode 1 includes a fourth step and a fifth step as optional steps. Specifically, in the method of producing the electrode 1, the first step, the fourth step, the fifth step, the second step, and the third step are carried out in this order. Further, each step is carried out, for example, by a roll-to-roll method. Further, all the first to the fifth steps are carried out, for example, using a chamber 13 common to the steps (described below in FIG. 2A to FIG. 2D).

<First Step>

As illustrated in FIG. 2A, a substrate film 2 is prepared in the first step.

In the present embodiment, the substrate film 2 has a long side in a first direction. The first direction is one direction included in the surface direction. Specifically, the first direction is a long-length direction. Specifically, the substrate film 2 is prepared in the shape of a roll.

The substrate film 2 includes a backup region 5 and a product region 6 in this order in the first direction.

The backup region 5 is not provided as a product and a preliminary region for forming a second conductive carbon layer 7 described below. Specifically, the backup region 5 is a one-side region of the substrate film 2 in the first direction. The backup region 5 is a region in which a metal underlying layer 3 and a conductive carbon layer 4, both of which are described below, are not disposed and instead the second conductive carbon layer 7 is preliminarily disposed before the formation of the conductive carbon layer 4.

The product region 6 is a region provided as a product. The product region 6 is, for example, the other-side region of the substrate film 2 in the first direction. The metal underlying layer 3 and conductive carbon layer 4 described below are disposed in the product region 6.

<Fourth Step>

In the fourth step, the substrate film 2 is heated under a reduced-pressure atmosphere. The fourth step is a heating step.

The pressure of the reduced-pressure atmosphere is not limited. The pressure is, for example, 10 Pa or less, preferably 1 Pa or less, more preferably 0.5 Pa or less, and, for example, more than 0 Pa.

For example, the heating of the substrate film 2 under a reduced-pressure atmosphere is carried out in a sputtering device 10 including a heating member 8 and a chamber 13. Although the details of the sputtering device 10 are described below, the substrate film 2 is heated with the heating member 8 included in the sputtering device 10.

The heating member 8 is, for example, a film deposition roll 15 equipped with a thermoregulator (not illustrated). Specifically, the substrate film 2 is heated by bringing the substrate film 2 into contact with a surface of the above-described film deposition roll 15.

In the fourth step, the whole of the backup region 5 and product region 6 of the substrate film 2 is heated under a reduced-pressure atmosphere.

In the fourth step, while the water inside the substrate film 2 is removed, the water adhering to an internal wall of the chamber 13 and the water adhering to a surface of the target 16 are allowed to remain.

<Fifth Step>

Illustrated in FIG. 2B, in the fifth step, sputtering is carried out to dispose the second conductive carbon layer 7 as a conductive carbon layer on one side of the substrate film 2 in the thickness direction. Specifically, in the fifth step, the second conductive carbon layer 7 is disposed by sputtering the one-side surface of the backup region 5 of the substrate film 2 in the thickness direction. In this manner, the second conductive carbon layer 7 is disposed on the one-side surface of the backup region 5 of the substrate film 2 in the thickness direction. On the other hand, in the fifth step, the second conductive carbon layer 7 is not disposed on the one-side surface of the product region 6 of the substrate film 2 in the thickness direction.

In the fifth step, under a reduced-pressure atmosphere, sputtering is carried out. The chamber 13 of the sputtering device 10 in the fifth step and the chamber 13 of the sputtering device 10 in the fourth step are the same. The conditions for the sputtering in the fifth step are not limited and, for example, the same as those of the sputtering in the third step. At least, electricity is applied to a target 16 consisting of sintered carbon.

As a result, carrying out the above-described fifth step suppresses the increase in the partial pressure of the water in the third step.

The substrate film 2 may be heated in the fifth step. The temperature for the heating is not limited.

In the present embodiment, in the fifth step, the velocity at which the substrate film 2 is conveyed is controlled so that only the backup region 5 of the long substrate film 2 is sputtered.

The second conductive carbon layer 7 disposed in the fifth step is in contact with the one-side surface of the backup region 5 of the substrate film 2 in the thickness direction.

The second conductive carbon layer 7 may or may not have the same structure and physical properties as those of the conductive carbon layer 4 described below. However, the second conductive carbon layer 7 does not have to function in the electrode 1. In the fifth step, the above-described sputtering of the second conductive carbon layer 7 is carried out before the sputtering of the conductive carbon layer 4 that functions in the electrode 1, and thus referred to as "pre-sputtering". Therefore, the fifth step is a pre-sputtering step.

<Second Step>

In the second step, the metal underlying layer 3 is disposed on the one-side surface of the substrate film 2 in the thickness direction. The metal underlying layer 3 is formed on at least the one-side surface of the product region 6 of the substrate film 2 in the thickness direction. However, in the second step of the present embodiment, the metal underlying layer 3 is not formed on the second conductive carbon layer 7 in the backup region 5.

The method of forming the metal underlying layer 3 is not limited. For example, a sputtering using the above-described sputtering device 10 is used. In the second step, electricity is applied to the target 16 consisting of the material of the metal underlying layer 3.

In the present embodiment, the metal underlying layer 3 is formed on the one-side surface of the product region 6 of the substrate film 2 in the thickness direction. In other words, the part of the long substrate film 2 in which the second conductive carbon layer 7 is not formed yet is conveyed toward the one side of the substrate film 2 in the first direction so that the film deposition roll 15 faces the target 16. In the present embodiment, after the second step, the whole of the backup region 5 and the product region 6 are wrapped around the second roll 12 (described below).

<Third Step>

In the third step, sputtering is carried out to dispose the conductive carbon layer 4 on one side of the substrate film 2 in the thickness direction.

At the sputtering, the partial pressure of the water in the chamber is, for example, $3.00 \times 10^{-4}$ Pa or less, preferably $2.00 \times 10^{-4}$ Pa or less, more preferably $1.50 \times 10^{-4}$ Pa or less, more preferably $1.45 \times 10^{-4}$ Pa or less, particularly preferably $1.40 \times 10^{-4}$ Pa or less, and $1.34 \times 10^{-4}$ Pa or less, $1.30 \times 10^{-4}$ Pa or less, and $1.20 \times 10^{-4}$ Pa or less are preferable. When the partial pressure of the water is the above-described upper limit or less, the durability of the produced electrode 1 improves.

On the other hand, the lower limit of the partial pressure of the water is not limited. The lower limit of the partial pressure of the water is, for example, $0.01 \times 10^{-4}$ Pa, further $0.05 \times 10^{-4}$ Pa.

The sputtering uses the sputtering device 10.

<Sputtering Device 10>

The sputtering device 10 includes, for example, a first accommodating unit 21, a film deposition unit 22, and a second accommodating unit 23. The sputtering device 10 further includes the chamber 13 and a partition wall 14.

The partition wall 14 defines the chamber 13 into three spaces. In this manner, the sputtering device 10 is equipped with the first accommodating unit 21, the film deposition unit 22, and the second accommodating unit 23 that include the three spaces, respectively.

The first accommodating unit 21 includes the first roll 11. The substrate film 2 can be reeled in to and out from the first roll 11.

The film deposition unit 22 is adjacent to the first accommodating unit 21. The chamber of the film deposition unit 22 is a film deposition chamber. The film deposition unit 22 includes the film deposition roll 15, the target 16, and the vacuum pump 17.

The film deposition roll 15 includes a thermoregulatory not illustrated. The thermoregulator can heat and cool a surface of the film deposition roll 15.

The target 16 contains sintered carbon.

The second accommodating unit 23 is adjacent to the film deposition unit 22. The second accommodating unit 23 is disposed on a side opposite to the first accommodating unit 21 relative to the film deposition unit 22. The second accommodating unit 23 includes the second roll 12. The substrate film 2 can be reeled in to and out from the second roll 12.

<Sputtering in Third Step>

The mode of sputtering is not limited. Examples of sputtering include magnetron sputtering, unbalanced magnetron sputtering, high-power pulsed sputtering, electron cyclotron resonance sputtering, RF sputtering, DC pulsed sputtering, and ion beam sputtering. Preferably, magnetron sputtering is used. To carry out a magnetron sputtering technique, a magnet not illustrated is provided to the film deposition unit 22. The magnet is disposed on a side opposite to the film deposition roll 15 relative to the target 16.

Examples of the sputtering gas include an inert gas. Examples of the inert gas include argon.

The film deposition roll 15 has a surface temperature of, for example, 0° C. or more, preferably 25° C. or more, more preferably 70° C. or more, even more preferably 100° C. or more, and, for example, 200° C. or less, preferably 150° C. or less.

The pressure of the sputtering gas is, for example, 1 Pa or less, and, for example, 0.1 Pa or more.

In this manner, the electrode 1 including the substrate film 2, the metal underlying layer 3, and the conductive carbon layer 4 in this order toward the one side in the thickness direction in the product region 6 is produced.

The electrode 1 includes the substrate film 2 and the second conductive carbon layer 7 in this order toward the one side in the thickness direction in the backup region 5.

Thereafter, the carbon electrode 1 including the product region 6 can be used as various electrodes and, preferably, used as the electrode for an electrochemical measurement to carry out an electrochemical measurement method, specifically, as the working electrode (working pole) to carry out cyclic voltammetry (CV), or as the working electrode (working pole) to carry out anodic stripping voltammetry (ASV).

Operations and Effects of One Embodiment

At the place 4.5 nm away from the one-side surface of the conductive carbon layer 4 toward the other side in the thickness direction in the electrode 1, the ratio (O/C) of oxygen to carbon is less than 0.01. This reduces repulsion between the one-side surface of the electrode 1 and the object to be measured (more specifically, the anions of ferricyan). Thus, the electrode 1 maintains excellent activity on the object to be measured (the anions of ferricyan) even after a long-term storage.

Further, when the ratio (O/C) of oxygen to carbon is less than 0.01 at the place 4.5 nm away from the one-side surface of the conductive carbon layer 4 toward the other side in the thickness direction, and 0.1 or less in the one-side surface of the conductive carbon layer 4 in the electrode 1, the electric charge of the one-side surface of the electrode 1 can be reduced, and thus the repulsion with ferricyan is reduced. As a result, the activity is maintained.

Further, in the electrode 1, the conductive carbon layer 4 has an $sp^2$ bond and an $sp^3$ bond. Thus, the potential window of the electrode 1 is extended while the electrode 1 has a high electrical conductivity.

In one embodiment, in the third step, the conductive carbon layer 4 is provided at one side of the substrate film 2 in the thickness direction by carrying out sputtering under the atmosphere under which the partial pressure of the water is $1.40 \times 10^{-4}$ Pa or less. This reduces the water content of the conductive carbon layer 4. Thus, the electrode has excellent durability of its activity. For example, this can reduce the rate of change in ΔEp from the time when the CV measurement of ferricyan is carried out using the above-described electrode 1 to the time when the CV measurement of ferricyan is carried out using the electrode 1 that has been left under a high-temperature atmosphere for a long period of time. The method of calculating the rate of change is described in Examples below. Further, ΔEp can be kept high.

Further, when the material of the substrate film 2 is resin, the substrate film 2 has excellent flexibility, and thus a roll-to-roll method can smoothly be carried out. On the other hand, when the material of the substrate film 2 is resin, the substrate film 2 contains a trace of water. Thus, in the subsequent third step, the partial pressure of the water tends to be high. However, in the subsequent fourth step of the present embodiment, the substrate film is heated under a reduced-pressure atmosphere and the water content of the substrate film 2 can be reduced. This suppresses, in the third step, the reduction in the durability of the electrode 1 due to the high partial pressure of the water.

Further, in one embodiment, the fifth step (pre-sputtering) is carried out using the chamber 13 common to the second step and the third step, and thus the water inside the chamber 13 used in the fifth step can be removed. Further, in the fifth step before the second step, the common chamber 13 and further the common target are used to preliminarily carry out sputtering to form the second conductive carbon layer 7 in the backup region 5, and thus the water near the target can be removed. This suppresses, in the third step, the reduction in the durability of the electrode 1 due to the high partial pressure of the water.

Furthermore, in the second step of one embodiment, the metal underlying layer 3 is disposed on the one-side surface of the substrate film 2 in the thickness direction, and thus an electrode 1 with even higher electrical conductivity can be produced.

Furthermore, when a substrate film 2 having a thickness of 10 μm or more and 500 μm or less is prepared in the first step of the one embodiment, a roll-to-roll method is carried out with the conveyable properties of the film.

(Variations)

In each of the variations, the same members and steps as in one embodiment will be given the same numerical references and the detailed description thereof will be omitted. Further, the variations can have the same operations and effects as those of one embodiment unless especially described otherwise. Furthermore, one embodiment and the variations can appropriately be combined.

As long as the fourth step is carried out between the first step and the third step, the time when the fourth step is carried is not limited.

The fourth step and/or the fifth step may not be carried out.

Furthermore, the second step and the fifth step can be carried out in sequence. Preferably, the fifth step and the second step are carried out in this order. This allows the chamber 13 from inside of which the water is removed in the second step to be used to form the metal underlying layer 3.

The second conductive carbon layer 7 and the conductive carbon layer 4 are formed in one substrate film 2. In a variation, however, they can be formed in separate substrate films 2.

EXAMPLE

Next, the present invention is more specifically described with reference to Examples and Comparative Examples. The present invention is not limited to Examples and Comparative Examples in any way. The specific numeral values used in the description below, such as blending ratios (content ratios), physical property values, and parameters, can be replaced with the corresponding blending ratios (content ratios), physical property values, and parameters in the above-described "DESCRIPTION OF THE EMBODIMENTS", including the upper limit values (numeral values defined with "or less" or "less than") or the lower limit values (numeral values defined with "or more" or "more than").

Example 1

As illustrated in FIG. 2A, a roll-shaped film consisting of polyethylene terephthalate with a thickness of 188 μm was prepared as the substrate film 2 (the first step). The substrate film 2 had a length of 50 m in the first direction.

As illustrated with arrows in solid line and dotted line in FIG. 2A, next, the substrate film 2 was set in the sputtering device 10. The surface temperature of the film deposition roll 15 was set to 60° C. and the film 2 was conveyed in a vacuum (at a pressure of 0.1 Pa) for 9 hours (the fourth step, heating step). In this manner, the water in the substrate film 2 was removed.

Next, as illustrated in FIG. 2B, pre-sputtering was carried out for 2 hours under the same conditions as those of the sputtering in the third step described in detail below. In this manner, the second conductive carbon layer 7 was formed on the one-side surface of the backup region 5 of the substrate film 2 in the thickness direction (the fifth step, pre-sputtering step). The second conductive carbon layer 7 in the backup region 5 had a length of 20 m in the first direction.

Next, as illustrated in FIG. 2C, using a magnetron sputtering technique, a metal underlying layer 3 consisting of titanium was formed on the one-side surface of the product region 6 of the substrate film 2 in the thickness direction (the second step). The conditions for the magnetron sputtering technique were as follows.

Targeted material: titanium
Target power: 3.3 W/cm$^2$
Sputtering gas: Argon
Pressure in the sputtering chamber: 0.3 Pa
The metal underlying layer 3 had a thickness of 7 nm.

Next, using a magnetron sputtering technique, the conductive carbon layer 4 was formed on a one-side surface of the metal underlying layer 3 in the product region 6 in the thickness direction (the third step). The conditions for the magnetron sputtering technique were as follows.

Targeted material: sintered carbon
Argon gas pressure: 0.4 Pa
Target power: 3.3 W/cm$^2$
Surface temperature of the film deposition roll 15: 60° C.

In the third step, in the atmosphere in the sputtering device 10, the partial pressure of the water was $1.13 \times 10^{-4}$ Pa.

The thickness of the conductive carbon layer 4 was 10 nm.

In this manner, an electrode 1 including the substrate film 2, the metal underlying layer 3, and the conductive carbon layer 4 in this order toward one side in the thickness direction in the product region 6 was produced.

Examples 2 to 6

In the same manner as Example 1, electrodes 1 were produced. The partial pressure of the water in the second step of each of Examples 2 to 6 was as shown in Table 1. The conditions for Examples 2 to 6 and Comparative Example 1 that were different from those of Example 1 are described below. These are also shown together with the partial pressure of the water in Table 1.

Example 2

In Example 2, the time of the pre-sputtering in the fifth step was changed from 2 hours to 1 hour and 30 minutes.

Example 3

In Example 3, the time of the pre-sputtering in the fifth step was changed from 2 hours to 1 hour.

Example 4

In Example 4, the fifth step (pre-sputtering) was not carried out.

Example 5

In Example 5, the fourth step was not carried out, and the time of the pre-sputtering in the fifth step was changed from 2 hours to 3 hours.

Example 6

As illustrated in FIG. 2A, first, a roll-shaped film consisting of polyethylene terephthalate with a thickness of 188 μm was prepared as the substrate film 2 (the first step). The substrate film 2 had a length of 50 m in the first direction.

Next, as illustrated in FIG. 2B, pre-sputtering was carried out for 3 hours under the same conditions as those of the sputtering in the third step. In this manner, the second conductive carbon layer 7 was formed on the one-side surface of the backup region 5 of the substrate film 2 in the thickness direction (the fifth step, pre-sputtering step). The second conductive carbon layer 7 in the backup region 5 had a length of 20 m in the first direction.

Next, as illustrated in FIG. 2C, using a magnetron sputtering technique, a metal underlying layer 3 consisting of titanium was formed on the one-side surface of the product region 6 of the substrate film 2 in the thickness direction (the second step). The conditions for the magnetron sputtering technique were as follows.

Targeted material: titanium
Target power: 3.3 W/cm$^2$
Sputtering gas: Argon
Pressure in the sputtering chamber: 0.2 Pa
The metal underlying layer 3 had a thickness of 7 nm.

Next, using a magnetron sputtering technique, a conductive carbon layer 4 was formed on the one-side surface of the metal underlying layer 3 in the product region 6 in the thickness direction (the third step). The conditions for the magnetron sputtering technique were as follows.

Targeted material: sintered carbon
Argon gas pressure: 0.2 Pa
Target power: 3.3 W/cm$^2$
Surface temperature of the film deposition roll 15: 120° C.

In the third step, in the atmosphere in the sputtering device 10, the partial pressure of the water was $1.25 \times 10^{-4}$ Pa.

The conductive carbon layer 4 had a thickness of 10 nm.

In this manner, an electrode 1 including the substrate film 2, the metal underlying layer 3, and the conductive carbon layer 4 in this order toward one side in the thickness direction in the product region 6 was produced.

Examples 7 and 8 and Comparative Example 1

In the same manner as Example 6, electrodes 1 were produced. The partial pressure of the water in the second step of each of Examples 7 and 8 and Comparative Example 1 was as shown in Table 1. The conditions for Examples 7 and 8 and Comparative Example 1 that are different from those of Example 1 are described below. These are shown together with the partial pressure of the water in Table 1.

Example 7

In Example 7, the time of the pre-sputtering in the fifth step was changed to 1 hour.

Example 8

In Example 8, the time of the pre-sputtering in the fifth step was changed to 30 minutes.

Comparative Example 1

In Comparative Example 1, the fifth step is not carried out.
<Evaluations>
1. Ratio (O/C) According to X-Ray Photoelectron Spectroscopy (ESCA)
<Preparation of Sample and Calculation Method>
A sample was obtained by cutting the electrode 1 of each of Examples 7 and 8 and Comparative Example 1 into a 1-cm square. The sample was fixed on a sample stage. Thereafter, the qualitative analysis of the sample was carried out with a wide scan measurement. Further, a depth profiling measurement using Ar ion etching was carried out to calculate the atomic percent [at. %] at the place 4.5 nm away from the one-side surface of the conductive carbon layer 4. In this manner, the ratio O/C was calculated. The analysis device and the measurement conditions are described below.
<Analysis Device and Measurement Conditions>
    Device: manufactured by ULVAC-PHI, Inc. Quantera SXM
    X-ray source: Monochrome Al Kα
    X Ray Setting: 100 pmcp [15 kV, 25 W]
    Photoelectron Take-off Angle: 45 degrees relative to the surface of the sample
    Charge neutralization condition: use both of a neutralization gun and an Ar ion gun (neutral mode)
    Accelerating Voltage of Ar ion gun: 1 kV
    Raster size of Ar ion gun: 2 mm×2 mm
    Etching Rate of Ar ion gun: approximately 1.5 nm/min in terms of $SiO^2$ The ratio O/C was calculated by calculating the atomic percent [at. %] of the one-side surface of the conductive carbon layer 4 of each of Examples 6 to 8 and Comparative Example 1.

2. Durability and Activity on Ferricyan

Using the electrode 1 of each of Examples 1 to 8 and Comparative Example 1, a CV measurement of ferricyan was carried out.

A sample electrode with a known electrode area was produced by bonding an insulating tape having a hole 2 mm in diameter to the one-side surface of the conductive carbon layer 4. Using the sample electrode as a working pole, cyclic voltammetry (CV) was carried out. In detail, the sample electrode was immersed in a 1M KCl aqueous solution. Further, 1 mL of $[Fe(CN)_6]^{4-}$ (ferricyanide ion) was added as an electrode active substance to the aqueous solution. In the CV measurement, the sweep of the potential was started from 0V, and the potential was swept from the positive side to the negative in a range of −0.1 V to 0.5 V. The sweep velocity of the potential was 0.1 V/s. The CV measurement was carried out at 23° C. The CV measurement was carried out three times. The average of the ΔEp values of the three CV measurements was obtained as the initial ΔEp.

Thereafter, the electrode 1 was left to stand at 23° C. for 4 weeks. Thereafter, the ΔEp after leaving the electrode 1 to stand was measured in the same manner as described above. The ΔEp was obtained as the changed activity on ferricyan. The unit of ΔEp was [mV]. It means that the lower the ΔEp is, the higher the activity of the electrode 1 after a long-term storage is (the higher the durability is).

Of the electrode 1 of each of Examples 1 to 5, the above-described value was substituted in the following formula, thereby obtaining the percentage of the rate of change in ΔEp.

Rate of Change (%)=[ΔEp after leaving the electrode 1 to stand −Initial ΔEp]/Initial ΔEp×100

It means that the lower the change rate is, the higher the durability of the electrode activity of the electrode 1 is.

TABLE 1

| Example• Comparative Example | Fourth Step (Heating) Presence or Absence | Fifth step (Pre-sputtering) Presence or Absence | Time (Unit: Hour) | Third Step Partial Pressure of Water (Pa) | O/C Ratio of Conductive Carbon Layer Place 4.5 nm Away from One-side Surface | One-side Surface | Evaluations of Electrode Change Rate (%) | Changed Activity on Ferricyan ΔEp |
|---|---|---|---|---|---|---|---|---|
| Ex. 1 | Presence | Presence | 2.0 | $1.13 \times 10^{-4}$ | 0.00 | — | 0% | 0.09 |
| Ex. 2 | Presence | Presence | 1.5 | $1.32 \times 10^{-4}$ | 0.00 | — | 16% | 0.12 |
| Ex. 3 | Presence | Presence | 1.0 | $1.35 \times 10^{-4}$ | 0.00 | — | 18% | 0.13 |
| Ex. 4 | Presence | Absence | 0.0 | $1.43 \times 10^{-4}$ | 0.00 | — | 30% | 0.14 |
| Ex. 5 | Absence | Presence | 3.0 | $1.45 \times 10^{-4}$ | 0.00 | — | 32% | 0.15 |
| Ex. 6 | Absence | Presence | 3.0 | $1.25 \times 10^{-4}$ | 0.00 | 0.07 | — | 0.18 |
| Ex. 7 | Absence | Presence | 1.0 | $1.82 \times 10^{-4}$ | 0.00 | 0.07 | — | 0.18 |
| Ex. 8 | Absence | Presence | 0.5 | $2.45 \times 10^{-4}$ | 0.00 | 0.07 | — | 0.19 |
| Comp. Ex. 1 | Absence | Absence | 0.0 | $3.43 \times 10^{-4}$ | 0.01 | 0.07 | — | 0.31 |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The electrode is used for electrochemical measurement methods.

DESCRIPTION OF REFERENCE NUMERALS 1 electrode
2 substrate film
3 metal underlying layer
4 conductive carbon layer
7 second conductive carbon layer
13 chamber

The invention claimed is:

1. An electrode comprising: a substrate film, a metal underlying layer, and a conductive carbon layer in this order toward one side in a thickness direction,
   wherein a ratio (O/C) of oxygen to carbon at a place 4.5 nm away from a one-side surface of the conductive carbon layer toward the other side in the thickness direction is less than 0.01, and
   wherein the ratio (O/C) of oxygen to carbon is measured using X-ray photoelectron spectroscopy.

2. The electrode according to claim 1,
   wherein a ratio (O/C) of oxygen to carbon at the one-side surface of the conductive carbon layer is 0.1 or less.

3. The electrode according to claim 1,
   wherein the conductive carbon layer has an $sp^2$ bond and an $sp^3$ bond.

4. A method of producing the electrode according to claim 1, the method comprising:
   a first step of preparing the substrate film;
   a second step of disposing the metal underlying layer on a one-side surface of the substrate film in the thickness direction; and
   a third step of carrying out sputtering under an atmosphere under which a partial pressure of water is $1.40 \times 10^{-4}$ Pa or less to dispose the conductive carbon layer on a one-side surface of the metal underlying layer in the thickness direction.

5. The method according to claim 4, further comprising:
   a fourth step of heating the substrate film under a reduced-pressure atmosphere at a time after the first step and before the third step,
   wherein a material of the substrate film is resin.

6. The method according to claim 4, further comprising:
   a fifth step of carrying out sputtering at a time after the first step and before the second step to dispose a second conductive carbon layer on one side of the substrate film in the thickness direction,
   wherein in the fifth step, the second step, and the third step, a chamber common to the steps is used for a roll-to-roll method.

7. The method according to claim 4, wherein the substrate film having a thickness of 10 μm or more and 500 μm or less is prepared in the first step.

* * * * *